(12) United States Patent
Nah

(10) Patent No.: US 9,468,088 B2
(45) Date of Patent: Oct. 11, 2016

(54) CONDUCTIVE FILM WITH HIGH TRANSMITTANCE HAVING A NUMBER OF ANTI REFLECTION COATINGS, TOUCH PANEL USING THE SAME AND MANUFACTURING METHOD THEREOF

(75) Inventor: Hyunmin Nah, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 698 days.

(21) Appl. No.: 13/703,775

(22) PCT Filed: Jun. 22, 2011

(86) PCT No.: PCT/KR2011/004538
§ 371 (c)(1),
(2), (4) Date: Dec. 12, 2012

(87) PCT Pub. No.: WO2011/162542
PCT Pub. Date: Dec. 29, 2011

(65) Prior Publication Data
US 2013/0087374 A1    Apr. 11, 2013

(30) Foreign Application Priority Data
Jun. 22, 2010 (KR) ................ 10-2010-0058999

(51) Int. Cl.
*H05K 1/00* (2006.01)
*H05K 1/02* (2006.01)
(Continued)

(52) U.S. Cl.
CPC ............ *H05K 1/0213* (2013.01); *G06F 3/044* (2013.01); *G06F 3/045* (2013.01); *H05K 3/0011* (2013.01)

(58) Field of Classification Search
CPC .. H05K 1/0213; H05K 3/0011; G06F 3/044; G06F 3/045

USPC ........ 174/258, 250, 251, 253, 255, 256, 257
See application file for complete search history.

(56) References Cited

U.S. PATENT DOCUMENTS 5,652,476 A     7/1997  Matsuda et al.
8,029,886 B2 *  10/2011 Nashiki et al. ............ 428/220
(Continued)

FOREIGN PATENT DOCUMENTS

CN     1328269 A    12/2001
CN     1424598 A     6/2003
(Continued)

OTHER PUBLICATIONS

International Search Report in International Application No. PCT/KR2011/004538, filed Jun. 22, 2011.
(Continued)

*Primary Examiner* — Tremesha S Willis
(74) *Attorney, Agent, or Firm* — Saliwanchik Lloyd & Eisenshcenk

(57) ABSTRACT

The present invention relates to a conductive film with high transmittance and having a number of anti reflection (AR) coated films, whereby transmittance of an ITO film can be improved by coating the number of anti reflection (AR) coating having a high refractivity and lower refractivity on the conductive film, and the present invention according to an exemplary embodiment can be advantageously applied to a touch panel of an ITO film/ITO film combination to obtain a clear image due to sufficient transmittance, wherein an exemplary embodiment of the present invention includes a conductive film formed with a transparent electrode pattern, and a number of anti reflection (AR) films formed on at least one surface of the conductive film to prevent optical reflection.

14 Claims, 5 Drawing Sheets

(51) Int. Cl.
*G06F 3/044* (2006.01)
*G06F 3/045* (2006.01)
*H05K 3/00* (2006.01)

(56) References Cited

U.S. PATENT DOCUMENTS

| | | |
|---|---|---|
| 8,227,077 B2 | 7/2012 | Nashiki et al. |
| 2005/0156520 A1* | 7/2005 | Tanaka et al. ................ 313/512 |
| 2009/0168136 A1* | 7/2009 | Jacobs ........................ 359/246 |
| 2009/0273581 A1 | 11/2009 | Kim et al. |
| 2010/0159639 A1* | 6/2010 | Sakata ......................... 438/104 |

FOREIGN PATENT DOCUMENTS

| | | |
|---|---|---|
| CN | 1241052 C | 2/2006 |
| CN | 10-1276005 A | 10/2008 |
| CN | 10-1393276 A | 3/2009 |
| CN | 10-1493534 A | 7/2009 |
| CN | 10-1713834 A | 5/2010 |
| DE | 3941797 A1 | 12/1989 |
| JP | 2003-041152 A | 2/2003 |
| JP | 2004-021550 A | 1/2004 |
| JP | 2007-212819 A | 8/2007 |
| JP | 2007-288184 A | 11/2007 |
| JP | 2007-534007 A | 11/2007 |
| JP | 2008-071531 A | 3/2008 |
| JP | 2009-075325 A | 4/2009 |
| JP | 2009-271531 A | 11/2009 |
| JP | 2010-023282 A | 2/2010 |
| KR | 10-0123437 B1 | 11/1997 |
| TW | 2008-27163 A | 7/2008 |
| TW | 2009-03402 A | 1/2009 |
| TW | M376828 U1 | 3/2010 |
| WO | WO-94-19709 | 9/1994 |

OTHER PUBLICATIONS

Office Action dated Nov. 24, 2014 in Chinese Application No. 201180031308.7.
Office Action dated Jan. 14, 2014 in Taiwanese Application No. 100121756.
Office Action dated Apr. 7, 2015 in Japanese Application No. 2013516504.

* cited by examiner

FIG. 1
(PRIOR ART)
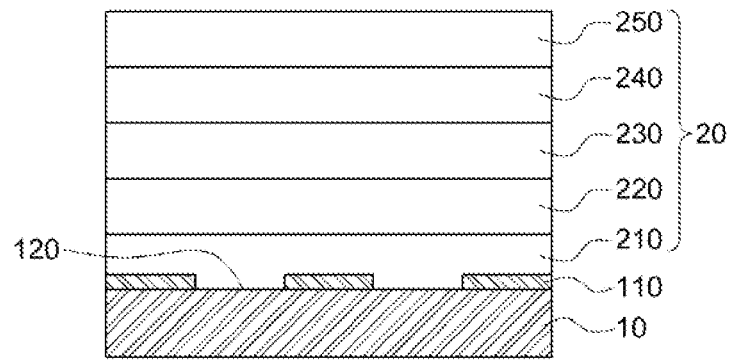
Figure 2a
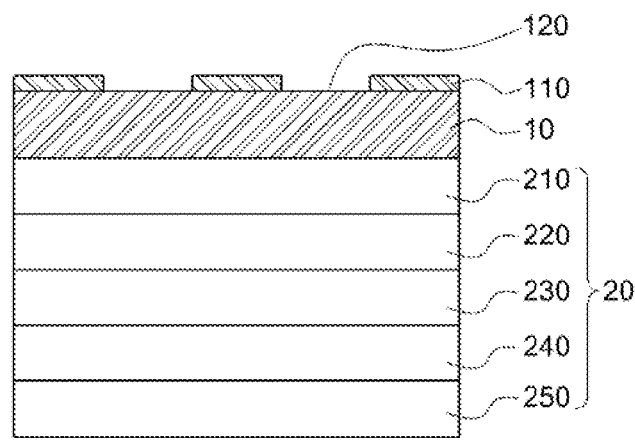
Figure 2b

Fig. 2c

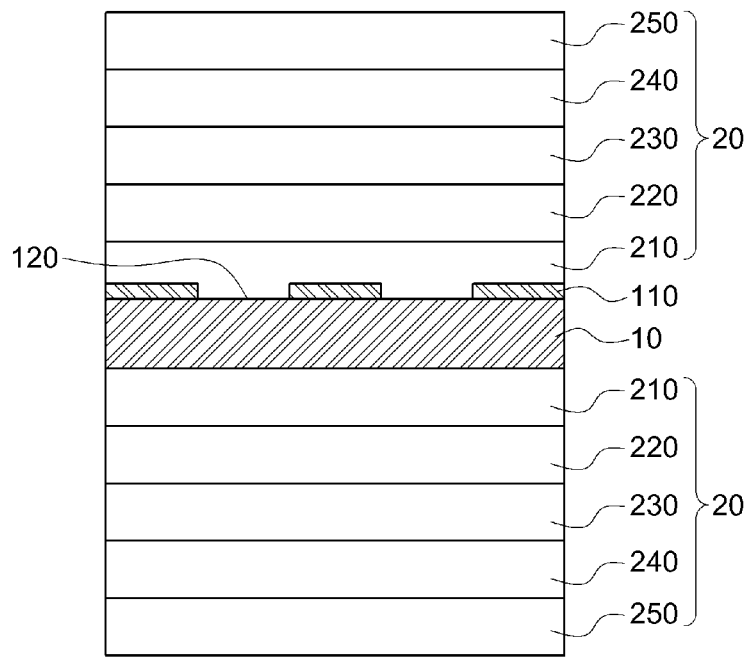

Fig. 3

| CLASSIFICATION | ORDER | FRONT COATING TRANSMITTANCE | | REAR COATING TRANSMITTANCE | |
|---|---|---|---|---|---|
| | | ITO PATTERN SURFACE | ETCHED SURFACE | ITO PATTERN SURFACE | ETCHED SURFACE |
| ITO FILM (BEFORE COATING) | | 86.35% | 85.84% | 86.35% | 85.84% |
| SiO/TiO2 Multilayer | FIRST | 91.92% | 92.32% | 89.18% | 88.19% |
| | SECOND | 91.35% | 91.78% | 88.92% | 87.83% |
| | THIRD | 91.59% | 91.77% | 89.05% | 87.98% |
| | FOURTH | 91.81% | 92.01% | 88.54% | 88.29% |
| | FIFTH | 91.91% | 91.86% | 88.27% | 87.65% |
| SiO2/TiO2 Multilayer | FIRST | 91.73% | 91.67% | 88.84% | 87.97% |
| | SECOND | 91.51% | 91.35% | 88.37% | 87.86% |
| | THIRD | 90.10% | 92.10% | 88.99% | 87.63% |
| | FOURTH | 91.56% | 91.28% | 89.08% | 88.13% |
| Al2O3/TiO2 Multilater | FIRST | 90.69% | 90.77% | 87.30% | 85.83% |
| | SECOND | 89.43% | 90.07% | 88.08% | 87.05% |
| | THIRD | 90.44% | 90.09% | 86.25% | 87.61% |
| MEASUREMENT SCOPE IS AVERAGE VALUE OF 450 nm ~ 650 nm | | | | | |

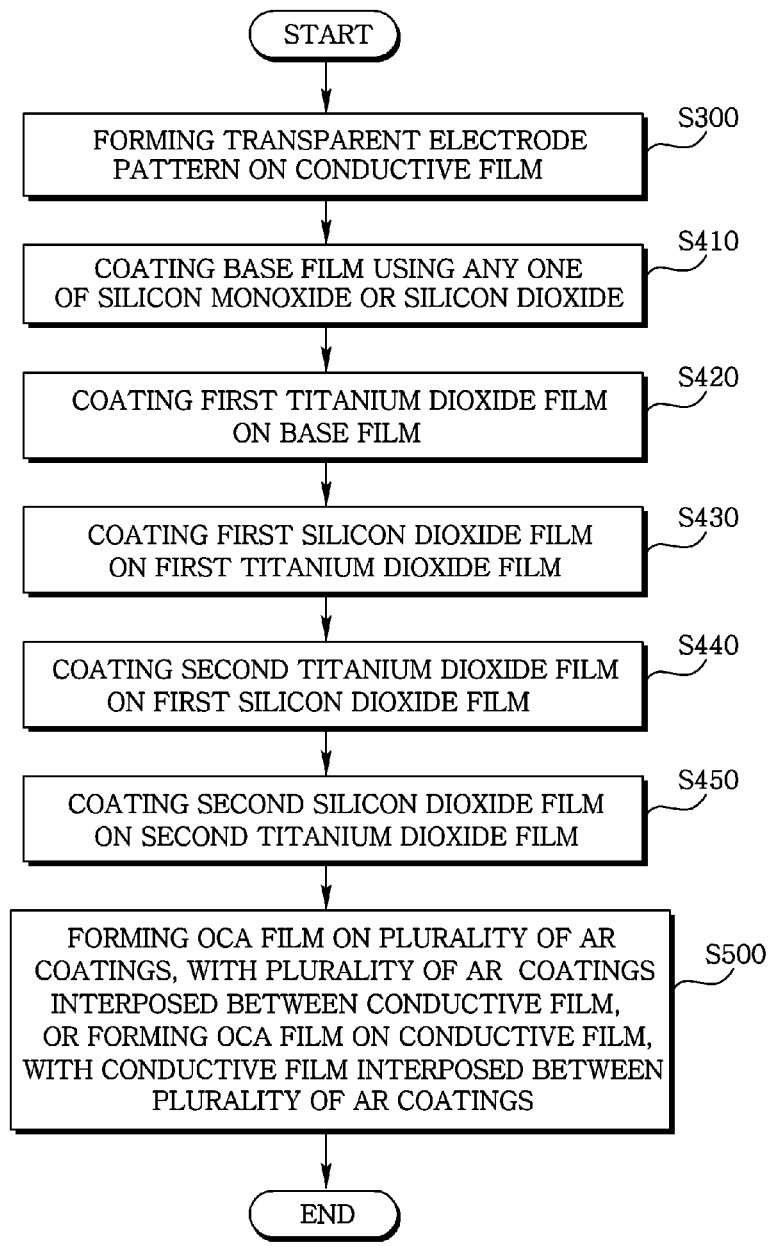

CONDUCTIVE FILM WITH HIGH TRANSMITTANCE HAVING A NUMBER OF ANTI REFLECTION COATINGS, TOUCH PANEL USING THE SAME AND MANUFACTURING METHOD THEREOF

CROSS-REFERENCE TO RELATED APPLICATIONS

This application is the U.S. national stage application of International Patent Application No. PCT/KR2011/004538, filed Jun. 22, 2011, which claims priority to Korean Application No. 10-2010-0058999, filed Jun. 22, 2010, the disclosures of each of which are incorporated herein by reference in their entirety.

TECHNICAL FIELD

The teachings in accordance with the exemplary embodiments of this invention relate generally to a conductive film with high transmittance. More particularly, the teachings in accordance with the exemplary embodiments of this invention relate to a conductive film formed with a number of anti reflection coatings to reduce reflectivity and yet to increase transmittance, a touch panel using the same, and a manufacturing method thereof.

BACKGROUND ART

FIG. 1 is a table showing a transmittance of a touch panel formed with an ITO (Indium Tin Oxide) film and an ITO glass according to prior art. Generally, the touch panel formed with the ITO film and an ITO glass has a transmittance of actual application scope, because the ITO glass is higher in transmittance by T % than the ITO film.

However, due to the fact that the transmittance of the ITO film is 85-89% level, a panel structure of a film combination of the ITO film/ITO glass may have a transmittance less than 80% arithmetically, resulting in failure to reach a commercializable transmittance. Therefore, there arises a need of requiring a conductive film capable of obtaining a high optical transmittance with a clear image, and a touch panel including the same.

DISCLOSURE OF INVENTION

Technical Problem

The present invention is directed to solve at least one or more of the aforementioned problems/disadvantages in whole or in part and to provide to a conductive film formed with a number of anti reflection (AR) coatings with a high refractivity and a low refractivity to increase a transmittance of an ITO film having a relatively low transmittance, a touch panel using the same, and a manufacturing method thereof.

Technical problems to be solved by the present invention are not restricted to the above-mentioned, and any other technical problems not mentioned so far will be clearly appreciated from the following description by skilled in the art.

Solution to Problem

An object of the invention is to overcome at least one or more of the above problems and/or disadvantages in whole or in part, and/or provide at least the advantages described hereinafter, and/or make improvements in the prior art. In order to achieve at least the above objects, in whole or in part, and in accordance with the purposes of the invention, as embodied and broadly described, and in one general aspect of the present invention, there is provided a conductive film with high transmittance and having a number of anti reflection (AR) coated films, comprising: a conductive film formed with a transparent electrode pattern; and a number of AR coated films formed at least on one surface of the conductive film for prevention of light reflection, wherein the number of AR coated films is sequentially coated on the one surface with a base film, a first titanium dioxide film, a first silicon dioxide, a second titanium dioxide film and a second silicon dioxide, and wherein the base film is coated with any one of silicon monoxide and silicon dioxide.

In another general aspect of the present invention, there is provided a conductive film with high transmittance and having a number of anti reflection (AR) coated films, comprising: a conductive film formed with a transparent electrode pattern; and a number of AR coated films formed at least on one surface of the conductive film for prevention of light reflection, wherein the number of AR coated films is sequentially coated on the one surface with a first Al2O3 film, a first titanium dioxide film, a second Al2O3 film, a second titanium dioxide film and a third Al2O3 film.

Preferably, the conductive film is any one of an ITO (Indium Tin Oxide) film, an ATO (Antimony Tin Oxide) film and an AZO (Antimony Zinc Oxide) film.

Preferably, in case the coated base film is silicon monoxide, thickness of the coated base film is 110 Å~140 Å, of the coated first titanium dioxide film is 190 Å~230 Å, thickness of the coated silicon monoxide film is 130 Å~210 Å, thickness of the coated second titanium dioxide film 730 Å~870 Å, and thickness of the second coated silicon dioxide film is 890 Å~1010 Å.

Preferably, in case the coated base film is silicon dioxide, thickness of the coated base film is 1590 Å~1670 Å, thickness of the first coated titanium dioxide film is 130 Å~170 Å, thickness of the first coated silicon monoxide film is 330 Å~380 Å, thickness of the second coated titanium dioxide film is 1190 Å~1210 Å, thickness of the second coated silicon dioxide film is 960 Å~980 Å.

Preferably, thickness of the first Al2O3 film is 970 Å~1030 Å, thickness of the first titanium monoxide film is 220 Å~260 Å, thickness of the second coated Al2O3 film is 190 Å~230 Å, of the second coated titanium dioxide film is 550 Å~610 Å, and thickness of the third coated Al2O3 film is 760 Å~820 Å.

Preferably, relative refractive index to air of the coated base film and the first coated Al2O3 film is 1.4~2.1.

Preferably, the conductive film with high transmittance and having a number of anti reflection (AR) coatings is a film coated by any one method of vacuum deposition method, spray method and wet method.

Preferably, wavelength of the light is 450 nm~650 nm.

In another general aspect of the present invention, there is provided a touch panel using a conductive film with high transmittance and having a number of anti reflection coating, the touch panel comprising:

a conductive film formed with a transparent electrode pattern; and a number of AR coated films formed at least on one surface of the conductive film for prevention of light reflection; and an optical clear adhesive (OCA) film formed on the number of AR coated films under which the conductive film is formed, or an optical transparent pressure-sensitive adhesive film formed on an upper surface of the conductive film, where the OCA film formed on an upper surface of the conductive film is interposed between the number of AR coated films, wherein the number of AR coatings is sequentially coated on the one surface with a base film, a first titanium dioxide film, a first silicon dioxide film, a second titanium dioxide film and a second silicon dioxide film, and wherein the base film is coated with any one of silicon monoxide, silicon dioxide and Al2O3.

Preferably, the OCA film is a decompressing type pressure-sensitive adhesive.

Preferably, the conductive film, the number of AR film and the OCA film are all provided in a plural manner.

Preferably, the plurality of conductive films include an upper conductive film in which each transparent electrode pattern faces the other transparent electrode pattern, and a bottom conductive film in which each transparent electrode pattern faces the other transparent electrode pattern.

Preferably, an air gap of a predetermined size is formed and maintained between the upper conductive film and the bottom conductive film.

Preferably, the touch panel further includes a spacer interposed between the upper and bottom conductive films to fuse the upper and bottom conductive films.

Preferably, the touch panel further includes a plurality of dot spacers formed on the upper conductive film or the bottom conductive film.

Preferably, in case the coated base film is silicon monoxide, thickness of the coated base film is 110 Å~140 Å, of the coated first titanium dioxide film is 190 Å~230 Å, thickness of the coated silicon monoxide film is 130 Å~210 Å, thickness of the coated second titanium dioxide film 730 Å~870 Å, and thickness of the second coated silicon dioxide film is 890 Å~1010 Å.

Preferably, in case the coated base film is silicon dioxide, thickness of the coated base film is 1590 Å~1670 Å, thickness of the first coated titanium dioxide film is 130 Å~170 Å, thickness of the first coated silicon monoxide film is 330 Å~380 Å, thickness of the second coated titanium dioxide film is 1190 Å~1210 Å, thickness of the second coated silicon dioxide film is 960 Å~980 Å.

In still further aspect of the present invention, there is provided a method of manufacturing a conductive film with high transmittance and having a number of anti reflection (AR) coated films, the method comprising: forming a transparent electrode pattern on a conductive film; and forming a number of AR coated films on at least one surface of the conductive film for prevention of light reflection, wherein the step of forming the number of AR coated films includes coating a base film using any one of silicon monoxide and silicon dioxide, coating a first titanium dioxide film on the base film, coating a first silicon dioxide film on the first titanium dioxide film, and coating a second titanium dioxide film on the first silicon dioxide film, and coating a second silicon dioxide film on the second titanium dioxide film.

In still further aspect of the present invention, there is provided a method of manufacturing a touch panel using a conductive film with high transmittance and having a number of anti reflection (AR) coated films, the method comprising: forming a transparent electrode pattern on a conductive film; and forming a number of AR coated films on at least one surface of the conductive film for prevention of light reflection; and forming an optical clear adhesive (OCA) film on an upper surface of the number of anti reflection (AR) coated films, with the number of anti reflection (AR) coated films interposed between the conductive films, or forming the OCA film on the upper surface of the conductive films, with the conductive films interposed between the number of anti reflection (AR) coated films, wherein the step of forming the number of AR coated films includes coating a base film on any one of silicon monoxide and silicon dioxide, coating a first titanium dioxide film on the base film, coating a first silicon dioxide film on the first titanium dioxide film, and coating a second titanium dioxide film on the first silicon dioxide film, and coating a second silicon dioxide film on the second titanium dioxide film.

Advantageous Effects of Invention

The present invention according to an exemplary embodiment has an advantageous effect in that transmittance of an ITO film can be improved by coating a number of anti reflection (AR) coated films having a high refractivity and lower refractivity on a conductive film, and the present invention according to an exemplary embodiment can be advantageously applied to a touch panel of an ITO film/ITO film combination to obtain a clear image thanks to sufficient transmittance.

BRIEF DESCRIPTION OF DRAWINGS

The teachings of the present invention can be readily understood by considering the following detailed description in conjunction with the accompanying drawings, in which:

FIG. 1 is a table showing a transmittance of a touch panel formed with an ITO (Indium Tin Oxide) film and an ITO glass according to prior art;

FIGS. 2a, 2b and 2c are cross-sectional views illustrating a conductive film with a high transmittance and having a number of anti reflection coated films (20) according to first, second and third exemplary embodiments of the present invention;

FIG. 3 is a table illustrating an optical transmittance according to each exemplary embodiment of a conductive film with a high transmittance and having a number of anti reflection coated film (20) according to the present invention;

FIG. 6 is a flowchart sequentially illustrating a method of manufacturing a touch panel formed with a conductive film with high transmittance and having a number of anti reflection (AR) coated films (20) according to an exemplary embodiment of the present invention.

BEST MODE FOR CARRYING OUT THE INVENTION

Figure 4:
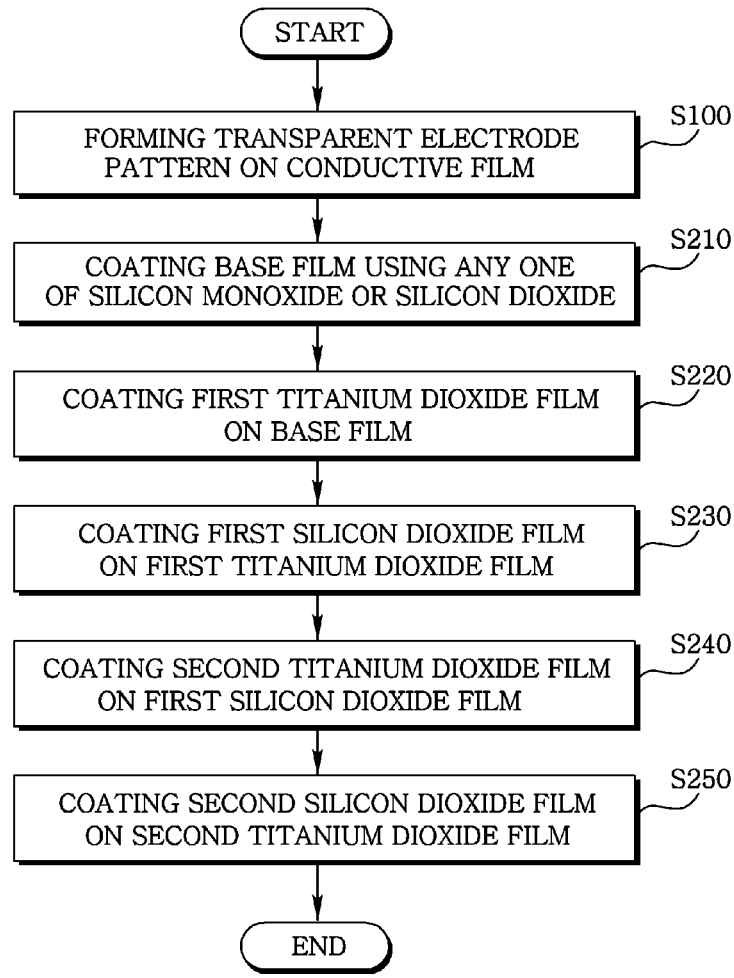
FIG. 4 is a flowchart sequentially illustrating a method of manufacturing a conductive film with high transmittance and having a number of anti reflection (AR) coated films (20) according to the present invention.

The following description is not intended to limit the invention to the form disclosed herein. Consequently, variations and modifications commensurate with the following teachings, and skill and knowledge of the relevant art are within the scope of the present invention. The embodiments described herein are further intended to explain modes known of practicing the invention and to enable others skilled in the art to utilize the invention in such, or other embodiments and with various modifications required by the particular application(s) or use(s) of the present invention.

The disclosed embodiments and advantages thereof are best understood by referring to FIGS. 1-6 of the drawings, like numerals being used for like and corresponding parts of the various drawings. Other features and advantages of the disclosed embodiments will be or will become apparent to one of ordinary skill in the art upon examination of the following figures and detailed description.

It is intended that all such additional features and advantages be included within the scope of the disclosed embodiments, and protected by the accompanying drawings. Further, the illustrated figures are only exemplary and not intended to assert or imply any limitation with regard to the environment, architecture, or process in which different embodiments may be implemented. Accordingly, the described aspect is intended to embrace all such alterations, modifications, and variations that fall within the scope and novel idea of the present invention.

It will be understood that the terms "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. That is, the terms "including", "includes", "having", "has", "with", or variants thereof may be used in the detailed description and/or the claims to denote non-exhaustive inclusion in a manner similar to the term "comprising".

Furthermore, "exemplary" is merely meant to mean an example, rather than the best. It is also to be appreciated that features, layers and/or elements depicted herein are illustrated with particular dimensions and/or orientation relative to one another for purposes of simplicity and ease of understanding, and that the actual dimensions and/or orientations may differ substantially from that illustrated. That is, in the drawings, the size and relative sizes of layers, regions and/or other elements may be exaggerated or reduced for clarity. Like numbers refer to like elements throughout and explanations that duplicate one another will be omitted. Now, the present invention will be described in detail with reference to the accompanying drawings.

In the specification and in the claims, coated films and coatings may be interchangeably used.

As used in the specification and in the claims, the singular form of "a", "an", and "the" include plural referents unless the context clearly dictates otherwise.

<Conductive Film with High Transmittance>

FIGS. 2a, 2b and 2c are cross-sectional views illustrating a conductive film with a high transmittance and having a number of anti reflection coated films (20) according to first, second and third exemplary embodiments of the present invention.

Now, each exemplary embodiment of the present invention will be described in detail with reference to the drawings.

First Exemplary Embodiment

A conductive film with a high transmittance and having a number of anti reflection coated films (20) according to the first exemplary embodiment of the present include a conductive film (10) formed with a transparent electrode pattern (110) and a number of anti reflection coated films (20) coated on the conductive film (10).

Particularly, the number of anti reflection coated films (20) include a first layer film (210), a second layer film (220), a third layer film (230), a fourth layer film (240) and a fifth layer film (250), each sequentially formed from a surface contacting the conductive film (10) for preventing light reflection. More particularly, the first exemplary embodiment illustrates the number of anti reflection coated films (20) coated on a front surface of the conductive film (10) formed with the transparent electrode pattern (110).

The number of anti reflection coated films (20) formed on at least one surface of the conductive film (10) are alternatively stacked with a coating material of high refractivity and a material of low refractivity to increase an optical transmittance (T %) and to decrease reflectivity by inducing elimination of optical interference in a particular waveband.

The conductive film (10) may be one of an ITO (Indium Tin Oxide) film, an ATO (Antimony Tin Oxide) film and an AZO (Antimony Zinc Oxide) film. Various transparent electrode patterns may be formed by processes including an etching process and the like, through a touch method on a touch panel to be used (e.g., electrostatic capacity method or resistive method).

The first layer film (210) is a base film having a relative refractive index to air of 1.4~2.1, and may be coated with silicon monoxide, silicon dioxide and Al2O3.

In a case the base film is silicon monoxide or silicon dioxide, the titanium oxide and the silicon dioxide are alternatively stacked from the second layer film (220) to coat the second layer film (220) to the fifth layer film (250).

That is, the second layer film (220) is coated with a first titanium oxide, the third layer film (230) is coated with a first silicon monoxide, the fourth layer film (240) is coated with a second titanium oxide, and the fifth layer film (250) is coated with a second silicon oxide. At this time, the provision of orders (such as first and second) to the coating material is to distinguish one layer from the other layer, and therefore, the coating materials thereof are same materials. The same applies to the other ensuing orders.

In a case a first Al2O3 is used for the first layer film (210), the second layer film is alternatively stacked with titanium oxide and Al2O3 to coat the second layer film (220) to the fifth layer film (250). That is, the second layer film (220) is coated with a first titanium oxide, the third layer film (230) is coated with a second Al2O3, the fourth layer film is coated with a second titanium oxide, and the fifth layer film (250) is coated with a third Al2O3.

Thickness of each film layer may be determined in consideration of optical wavelength for prevention of light reflection, such that the optical wavelength for prevention of light reflection is limited to a visible light wavelength of 450 nm~650 nm for assuring transparency for users.

Therefore, it would be preferable that light reflection prevention be performed on light of same optical wavelength by setting up same thickness of film layer on an upper surface of the transparent electrode pattern (110) and an upper surface of an etching surface (120). Thickness of each film will be described later based on experimental examples.

Second Exemplary Embodiment

The second exemplary embodiment of the conductive film with a high transmittance and having a number of anti reflection coated films (20) includes, as shown in FIG. 2b, a conductive film (10) formed with a transparent electrode film pattern (110) and a number of AR films (20) coated in an opposite direction from that of the transparent electrode film pattern (110) on the conductive film (10).

As in the first exemplary embodiment, the number of anti reflection coated films (20) include a first layer film (210), a second layer film (220), a third layer film (230), a fourth layer film (240) and a fifth layer film (250), each sequentially formed from a surface contacting the conductive film (10) for preventing light reflection, where like reference numerals are used for like and corresponding films of the same layer.

In second exemplary embodiment, the number of anti reflection coated films (20) are formed on a rear surface of the conductive film (10) formed with the transparent electrode pattern (110), such that material of film at each layer, the number of layers at each film, and thickness of each film (described later) are same as those of the first exemplary embodiment.

Third Exemplary Embodiment

The third exemplary embodiment of the conductive film with a high transmittance and having a number of anti reflection coated films (20) is a configuration where the number of anti reflection coated films (20) is coated on all the front and rear surfaces to further increase the transmittance and yet to reduce reflectivity, as shown in FIG. 2c.

In third exemplary embodiment, the number of anti reflection coated films (20) are formed on front and rear surfaces of the conductive film (10) formed with the transparent electrode pattern (110), such that material of film at each layer, the number of layers at each film, and thickness of each film (described later) are same as those of the first and second exemplary embodiments.

Experimental Examples

FIG. 3 is a table illustrating an optical transmittance according to each exemplary embodiment of a conductive film with a high transmittance and having a number of anti reflection coated film (20) according to the present invention.

In the experimental example, the transparent electrode pattern (110) is formed on the conductive film (10) as a test pattern, where the transparent electrode pattern (110) and the etching surface (120) are all provided with a thickness of 3 cm. As illustrated in FIG. 3, it could be noted that a high transmittance (T %) was produced from most of the optical wavelengths of 450 nm~650 nm under conditions of the following Tables 1 to 6.

In a case the first layer film (210), which is a base film for the conductive film, is made of silicon monoxide, thickness of each film at each layer of the AR films in the first exemplary embodiment of conductive film with a high transmittance (front coating for the conductive film 10) is as provided in the following Table 1, where order applied to the film is an experimental order based on thickness change of each film at the layer.

TABLE 1

| Order | 1st layer/SiO | 2nd layer/TiO$_2$ | 3rd layer/SiO$_2$ | 4th layer/TiO$_2$ | 5th layer/SiO$_2$ |
| --- | --- | --- | --- | --- | --- |
| 1st | 119 Å | 195 Å | 158 Å | 740 Å | 899 Å |
| 2nd | 119 Å | 195 Å | 138 Å | 740 Å | 899 Å |
| 3rd | 130 Å | 219 Å | 170 Å | 829 Å | 970 Å |
| 4th | 130 Å | 200 Å | 170 Å | 829 Å | 970 Å |
| 5th | 130 Å | 200 Å | 200 Å | 829 Å | 970 Å |

Furthermore, in a case the first layer film (210), which is a base film for the conductive film, is made of silicon dioxide, thickness of each film at each layer of the AR films in the first exemplary embodiment of conductive film with a high transmittance (front coating for the conductive film 10) is as provided in the following Table 2, where order applied to the film is an experimental order based on thickness change of each film at the layer.

TABLE 2

| Order | 1st layer/SiO$_2$ | 2nd layer/TiO$_2$ | 3rd layer/SiO$_2$ | 4th layer/TiO$_2$ | 5th layer/SiO$_2$ |
| --- | --- | --- | --- | --- | --- |
| 1st | 1600 Å | 143 Å | 367 Å | 1200 Å | 968 Å |
| 2nd | 1660 Å | 143 Å | 367 Å | 1200 Å | 968 Å |
| 3rd | 1660 Å | 143 Å | 342 Å | 1200 Å | 968 Å |
| 4th | 1660 Å | 173 Å | 342 Å | 1200 Å | 968 Å |

Furthermore, in a case the first layer film (210), which is a base film for the conductive film, is made of Al2O3, thickness of each film at each layer of the AR films in the first exemplary embodiment of conductive film with a high transmittance (front coating for the conductive film 10) is as provided in the following Table 3, where order applied to the film is an experimental order based on thickness change of each film at the layer.

TABLE 3

| Order | 1st layer/Al$_2$O$_3$ | 2nd layer/TiO$_2$ | 3rd layer/Al$_2$O$_3$ | 4th layer/TiO$_2$ | 5th layer/Al$_2$O$_3$ |
| --- | --- | --- | --- | --- | --- |
| 1st | 1021 Å | 246 Å | 214 Å | 596 Å | 808 Å |
| 2nd | 1000 Å | 246 Å | 214 Å | 596 Å | 808 Å |
| 3rd | 1000 Å | 240 Å | 209 Å | 581 Å | 791 Å |

Furthermore, in a case the first layer film (210), which is a base film for the conductive film, is made of silicon monoxide, thickness of each film at each layer of the AR films in the second exemplary embodiment of conductive film with a high transmittance (rear coating for the conductive film 10) is as provided in the following Table 4, where order applied to the film is an experimental order based on thickness change of each film at the layer.

TABLE 4

| Order | 1st layer/SiO | 2nd layer/TiO$_2$ | 3rd layer/SiO$_2$ | 4th layer/TiO$_2$ | 5th layer/SiO$_2$ |
| --- | --- | --- | --- | --- | --- |
| 1st | 130 Å | 219 Å | 170 Å | 829 Å | 970 Å |
| 2nd | 130 Å | 199 Å | 170 Å | 767 Å | 970 Å |
| 3rd | 135 Å | 206 Å | 175 Å | 857 Å | 994 Å |
| 4th | 115 Å | 187 Å | 154 Å | 709 Å | 875 Å |
| 5th | 119 Å | 195 Å | 158 Å | 740 Å | 899 Å |

Furthermore, in a case the first layer film (210), which is a base film for the conductive film, is made of silicon dioxide, thickness of each film at each layer of the AR films in the second exemplary embodiment of conductive film with a high transmittance (rear coating for the conductive film 10) is as provided in the following Table 5, where order applied to the film is an experimental order based on thickness change of each film at the layer.

TABLE 5

| Order | 1st layer/SiO$_2$ | 2nd layer/TiO$_2$ | 3rd layer/SiO$_2$ | 4th layer/TiO$_2$ | 5th layer/SiO$_2$ |
| --- | --- | --- | --- | --- | --- |
| 1st | 1600 Å | 143 Å | 367 Å | 1200 Å | 968 Å |
| 2nd | 1660 Å | 143 Å | 367 Å | 1200 Å | 968 Å |
| 3rd | 1660 Å | 153 Å | 367 Å | 1200 Å | 968 Å |
| 4th | 1660 Å | 163 Å | 367 Å | 1200 Å | 968 Å |

Still furthermore, in a case the first layer film (210), which is a base film for the conductive film, is made of Al2O3, thickness of each film at each layer of the AR films in the second exemplary embodiment of conductive film with a high transmittance (rear coating for the conductive film 10) is as provided in the following Table 5, where order applied to the film is an experimental order based on thickness change of each film at the layer.

TABLE 6

| Order | 1st layer/$Al_2O_3$ | 2nd layer/$TiO_2$ | 3rd layer/$Al_2O_3$ | 4th layer/$TiO_2$ | 5th layer/$Al_2O_3$ |
|---|---|---|---|---|---|
| 1st | 1000 Å | 246 Å | 214 Å | 596 Å | 808 Å |
| 2nd | 1021 Å | 246 Å | 214 Å | 596 Å | 808 Å |
| 3rd | 979 Å | 234 Å | 205 Å | 566 Å | 775 Å |

Mode for the Invention

<Method for Manufacturing Conductive Film with High Transmittance>

FIG. 4 is a flowchart sequentially illustrating a method of manufacturing a conductive film with high transmittance and having a number of anti reflection (AR) coated films (20) according to the present invention.

Referring to FIG. 4, the transparent electrode pattern (110) is formed on the conductive film (10) (S100). Next, a number of anti reflection (AR) coated films (20) are formed on at least one surface (front surface or/and rear surface) of the conductive film (10) (S200), whereby a method of manufacturing a conductive film with high transmittance and having a number of anti reflection (AR) coated films (20) according to the present invention is performed.

However, the number of anti reflection (AR) coated films (20) may be coated by any one coating method selected from a group of vacuum deposition method (sputtering method, electronic beam method), spray method and wet method, and particularly, in a case the vacuum deposition method is employed, careful attention must be paid because thickness of coated film may vary according to temperature of a substrate (e.g., ITO film).

At this time, the step of forming the number of AR coated films (S200) includes coating a base film using any one of silicon monoxide and silicon dioxide (S210), coating a first titanium dioxide film on the base film (S220), coating a first silicon dioxide film on the first titanium dioxide film (S230), coating a second titanium dioxide film on the first silicon dioxide film (S240), and lastly coating a second silicon dioxide film on the second titanium dioxide film (S250), whereby coating of the number of anti reflection (AR) films (20) on the conductive film (10) is performed according to the present invention.

<Touch Panel with High Transmittance>

Figure 5A:
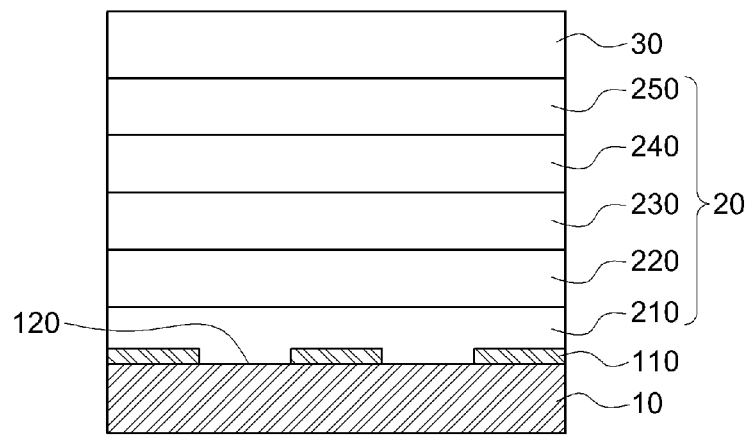
FIGS. 5a through 5c are cross-sectional views illustrating a touch panel formed with manufacturing a conductive film with high transmittance and having a number of anti reflection (AR) coated films (20) according to first, second and third exemplary embodiments of the present invention.
Figure 5B:
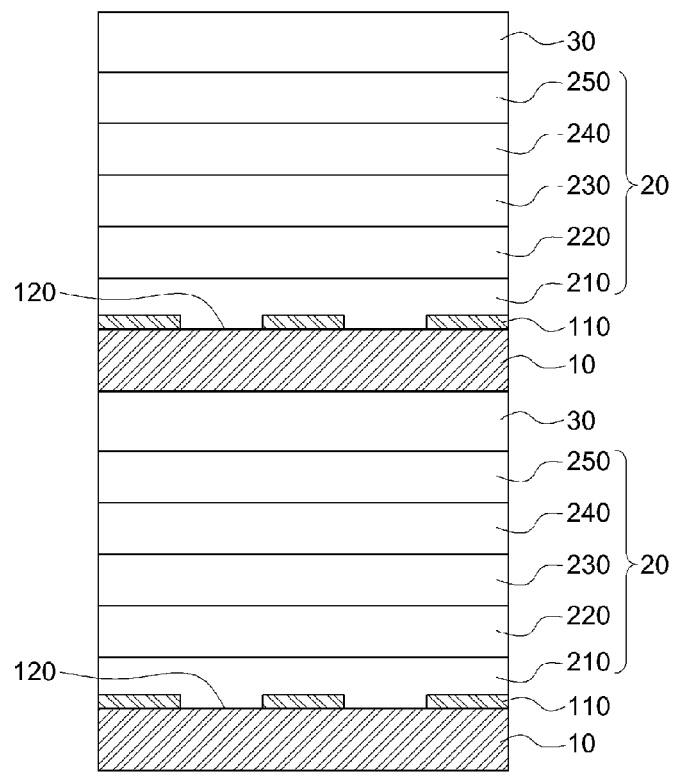
Figure 5C:
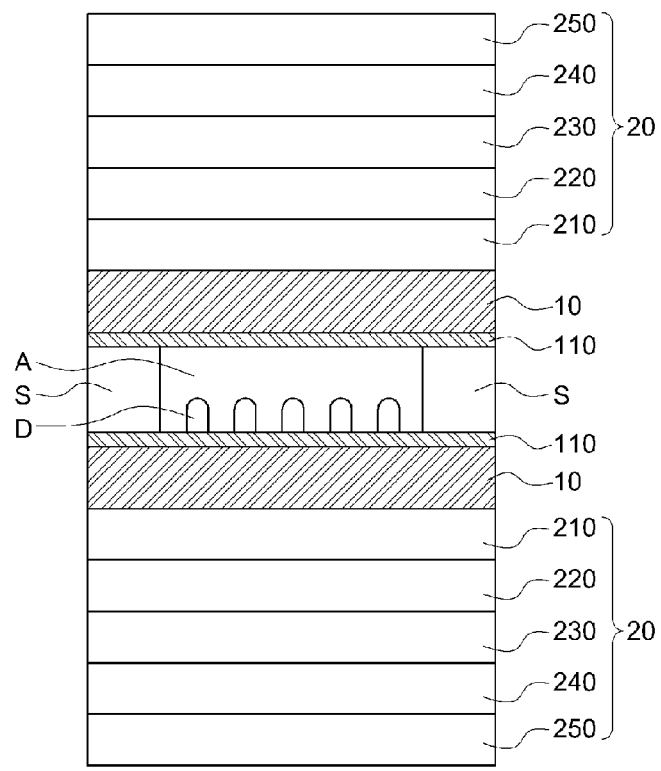

FIGS. 5a through 5c are cross-sectional views illustrating a touch panel formed with manufacturing a conductive film with high transmittance and having a number of anti reflection (AR) coated films (20) according to first, second and third exemplary embodiments of the present invention, where it should be apparent that various modifications are available because FIGS. 5a to 5c illustrate the touch panel manufactured by using some of the exemplary embodiments out of various exemplary embodiments of the conductive film with high transmittance.

That is, an optical clear adhesive (OCA, 30) film may be formed on the number of AR coated films (20) with the conductive film (20) among the number of AR coated films (20), or formed on the conductive film (20) with the conductive film (20) among the number of AR coated films (20).

As illustrated in FIG. 5a for the first exemplary embodiment of the touch panel, the optical clear adhesive (30) may be fused on the number of AR coated films (20) to be a first layer of a touch panel by way of electrostatic capacity method.

Of course, the transparent electrode pattern (110) is formed to an axis of one direction and an axis perpendicular to the said axis of one direction to thereby know a touch position based on changes of electrostatic capacity caused by the touch position. Furthermore, the OCA (30) is an Optical Clear Adhesive and simultaneously a decompressing pressure-sensitive adhesive.

As illustrated in FIG. 5b for the second exemplary embodiment of the touch panel, each transparent electrode pattern (110) is formed on the conductive film (10) to an axis of one direction and an axis perpendicular to the said axis of one direction, the number of AR coated films (210, 220, 230, 240, 250) are formed on the each transparent electrode pattern (110), and fused by the OCA (30) to configure a second layer of a touch panel of electrostatic capacity method.

As illustrated in FIG. 5c for the third exemplary embodiment of the touch panel, the conductive films (10) formed with the transparent electrode pattern (110) are formed on and under, and interposed between an air gap (A) to implement a touch panel of electrostatic capacity method. Of course, it should be apparent that the number of AR coated films (210, 220, 230, 240, 250) are coated on each conductive film (10) to implement a touch panel with high transmittance through prevention of optical reflection.

Furthermore, the third exemplary embodiment of the touch panel of FIG. 5c may include a spacer (S) fusing the upper and bottom conductive films (10) by being interposed between the upper and bottom conductive films (10) in order for conductive film (10) formed with the transparent electrode pattern (110) to maintain the air gap (A).

Furthermore, the spacer (S) may include a silver electrode (not shown) and a double-sided OCA (not shown), a detailed configuration of which is omitted as it is prior art. In addition, a dotted spacer (D) formed on the upper conductive film or the bottom conductive film may be added to allow the conductive film (10) to be more repulsive to outside touching power.

<Method for Manufacturing Touch Panel with High Transmittance>

FIG. 6 is a flowchart sequentially illustrating a method of manufacturing a touch panel formed with a conductive film with high transmittance and having a number of anti reflection (AR) coated films (20) according to an exemplary embodiment of the present invention.

Referring to FIG. 6, the conductive film (10) is formed with the transparent electrode pattern (110) (S300). Then, a number of AR coated films is formed on at least one surface of the conductive film for prevention of light reflection (S400).

Lastly, the optical clear adhesive (OCA) film is formed on an upper surface of the number of anti reflection (AR) coated films, with the number of anti reflection (AR) coated films interposed between the conductive films, or forming the OCA film on the upper surface of the conductive films, with the conductive films interposed between the number of anti reflection (AR) coated films (S500), where the step of forming the number of AR coated films (S400) may include coating a base film on any one of silicon monoxide and silicon dioxide (S410), coating a first titanium dioxide film on the base film (S420), coating a first silicon dioxide film on the first titanium dioxide film (S430), and coating a second titanium dioxide film on the first silicon dioxide film (S440), and coating a second silicon dioxide film on the second titanium dioxide film (S450).

The previous description of the present invention is provided to enable any person skilled in the art to make or use the invention. Various modifications to the invention will be readily apparent to those skilled in the art, and the generic principles defined herein may be applied to other variations without departing from the spirit or scope of the invention. Thus, the invention is not intended to limit the examples described herein, but is to be accorded the widest scope consistent with the principles and novel features disclosed herein.

INDUSTRIAL APPLICABILITY

The present invention has industrial applicability in that a conductive film capable of improving a transmittance of an ITO film and a touch panel can be implemented.

The invention claimed is:

1. A conductive film comprising:
   a film;
   a transparent electrode pattern on a surface of the film; and
   a plurality of anti-reflection (AR) films on at least one surface of the film,
   wherein the plurality of AR films includes:
   a first Al2O3 film on the at least one surface of the film,
   a first titanium dioxide film on the first Al2O3 film,
   a second Al2O3 film on the first titanium dioxide film,
   a second titanium dioxide film on the second Al2O3 film, and
   a third Al2O3 film on the second titanium dioxide film, and
   wherein the first Al2O3 film has a thickness in a range of 970 Å to 1030 Å, the first titanium dioxide film has a thickness in a range of 220 Å to 260 Å, the second Al2O3 film has a thickness in a range of 190 Å to 230 Å, the second titanium dioxide film has a thickness in a range of 550 Å to 610 Å, and the third Al2O3 film has a thickness in a range of 760 Å to 820 Å.

2. A conductive film comprising:
   a film;
   a transparent electrode pattern on a surface of the film; and
   a plurality of AR films on at least one surface of the film,
   wherein the plurality of AR films includes:
   a base film on the at least one surface of the film, the base film including any one of silicon monoxide and silicon dioxide,
   a first titanium dioxide film on the base film,
   a first silicon dioxide film on the first titanium dioxide film,
   a second titanium dioxide film on the first silicon dioxide film, and
   a second silicon dioxide film on the second titanium dioxide, and
   wherein, in the case where if the base film includes silicon monoxide, the thickness of the base film is has a thickness in a range of 110 Å to 140 Å, the thickness of the first titanium dioxide film is has a thickness in a range of 190 Å to 230 Å, the thickness of the first silicon dioxide film is has a thickness in a range of 130 Å to 210 Å, the thickness of the second titanium dioxide film is has a thickness in a range of 730 Å to 870 Å, and the thickness of the second silicon dioxide film is has a thickness in a range of 890 Å to 1010 Å, and
   wherein, in the case where if the base film includes silicon dioxide, the thickness of the base film is has a thickness in a range of 1590 Å to 1670 Å, the thickness of the first titanium dioxide film is has a thickness in a range of 130 Å to 170 Å, the thickness of the first silicon dioxide film is has a thickness in a range of 330 Å to 380 Å, the thickness of the second titanium dioxide film is has a thickness in a range of 1190 Å to 1210 Å, and the thickness of the second silicon dioxide film is has a thickness in a range of 960 Å to 980 Å.

3. The conductive film of claim 1, wherein the first Al2O3 film has a relative refractive index to air of the first Al2O3 film is in a range of 1.4 to 2.1.

4. The conductive film of claim 1, wherein the plurality of AR films inhibits reflection of light having a wavelength in a range of 450 nm to 650 nm.

5. A touch panel comprising:
   the conductive film of claim 2; and
   an optical clear adhesive (OCA) film on the plurality of AR films or on a surface of the film other than the surface of the film that the plurality of AR films is disposed on.

6. The touch panel of claim 5, wherein the OCA film includes a pressure-sensitive adhesive.

7. The touch panel of claim 5, wherein the film having the transparent electrode pattern formed thereon includes a first film and a second film facing the first film,
   wherein the transparent electrode pattern includes a first pattern on the first film and a second pattern on the second film, and
   wherein the first and second patterns face each other.

8. The touch panel of claim 7, wherein an air gap is formed between the first film and the second film.

9. The touch panel of claim 8, further comprising:
   a spacer between the first and second films to allow the first and second films to be fused.

10. The touch panel of claim 8, further comprising:
    a plurality of dot spacers on the first film or the second film.

11. The conductive film of claim 2, wherein the base film has a relative refractive index to air in a range of 1.4 to 2.1.

12. The touch panel of claim 5, wherein the base film has a relative refractive index to air in a range of 1.4 to 2.1.

13. A touch panel comprising:
    a film;
    a transparent electrode pattern on the film;
    a base film coated on one surface of the film;
    a plurality of AR films sequentially formed on the base film; and
    an OCA film on the plurality of AR films or on another surface of the film;
    wherein the base film includes any one of silicon monoxide and silicon dioxide and directly contacts the transparent electrode pattern,
    wherein the plurality of AR films includes a first titanium dioxide film, first silicon dioxide film, a second titanium dioxide film, and a second silicon dioxide film;
    wherein, if the base film includes silicon monoxide, the base film has a thickness in a range of 110 Å to 140 Å, the first titanium dioxide film has a thickness in a range of 190 Å to 230 Å, the first silicon dioxide film has a thickness in a range of 130 Å to 210 Å, the second titanium dioxide film has a thickness in a range of 730

Å to 870 Å, and the second silicon dioxide film has a thickness in a range of 890 Å to 1010 Å; and wherein, if the base film includes silicon dioxide, the base film has a thickness in a range of 1590 Å to 1670 Å, the first titanium dioxide film has a thickness in a range of 130 Å to 170 Å, the first silicon dioxide film has a thickness in a range of 330 Å to 380 Å, the second titanium dioxide film has a thickness in a range of 1190 Å to 1210 Å, and the second silicon dioxide film has a thickness in a range of 960 Å to 980 Å.

14. A touch panel comprising: the conductive film of claim 1; and an optical clear adhesive (OCA) film on the plurality of AR films or on a surface of the film other than the surface of the film that the plurality of AR films is disposed on.

* * * * *